United States Patent
Johnson

(10) Patent No.: US 7,937,952 B2
(45) Date of Patent: May 10, 2011

(54) THERMOELECTRIC COOLER WITH MULTIPLE TEMPERATURE ZONES

(75) Inventor: Brad Vaughn Johnson, Santa Clara, CA (US)

(73) Assignee: Emcore Corporation, Albuquerque, NM (US)

( * ) Notice: Subject to any disclaimer, the term of this patent is extended or adjusted under 35 U.S.C. 154(b) by 357 days.

(21) Appl. No.: 12/252,925

(22) Filed: Oct. 16, 2008

(65) Prior Publication Data

US 2010/0095685 A1    Apr. 22, 2010

(51) Int. Cl.
    F25B 21/02    (2006.01)
(52) U.S. Cl. .............................. 62/3.2; 62/3.7
(58) Field of Classification Search ............ 62/3.2, 62/3.3, 3.6, 3.7
    See application file for complete search history.

(56) References Cited

U.S. PATENT DOCUMENTS

| | | | |
|---|---|---|---|
| 3,958,324 A | 5/1976 | Alais et al. | |
| RE30,652 E | 6/1981 | Germano et al. | |
| 5,940,784 A * | 8/1999 | El-Husayni | 702/130 |
| 6,907,739 B2 * | 6/2005 | Bell | 62/3.7 |
| 6,981,380 B2 | 1/2006 | Chrysler et al. | |

OTHER PUBLICATIONS

Godfrey, Sara. "An Introduction to Thermoelectric Coolers." Web publication, 6 pages. http://www.melcor.com/tec_intro.html. Melcor Corporation, a unit of Laird Technologies. Trenton, New Jersey.

"Thermoelectric Product Information: A Brief Introduction to Thermoelectrics." Web publication, 2 pages. http://www.melcor.com/prodinfo.html. Melcor Corporation, a unit of Laird Technologies. Trenton, New Jersey.

"Thermoelectric Cooler—SP5446." Technical Data Sheet. Web publication, 2 pages. http://www.marlow.com. Marlow Industries, a subsidiary of II-VI incorporated. Dallas, Texas.

"DT3-4. Product Information for." Web publication, 1 page. http://www.marlow.com/Products/productpage.asp?ProductID=59. Marlow Industries, a subsidiary of II-VI incorporated. Dallas, Texas.

"DT12-2.5. Product Information for." Web publication, 1 page. http://www.marlow.com/Products/productpage.asp?ProductID=50. Marlow Industries, a subsidiary of II-VI incorporated. Dallas, Texas.

"DT12-6. Product Information for." Web publication, 2 pages. http://www.marlow.com/Products/productpage.asp?ProductID=52. Marlow Industries, a subsidiary of II-VI incorporated. Dallas, Texas.

"SP1507. Product Information for." Web publication, 2 pages. http://www.marlow.com/Products/productpage.asp?ProductID=25. Marlow Industries, a subsidiary of II-VI incorporated. Dallas, Texas.

"SP5083. Product Information for." Web publication, 2 pages. http://www.marlow.com/Products/productpage.asp?ProductID=31. Marlow Industries, a subsidiary of II-VI incorporated. Dallas, Texas.

(Continued)

*Primary Examiner* — Melvin Jones

(57) ABSTRACT

The present application is directed to thermoelectric coolers that include multiple temperature zones. The thermoelectric cooler may include a first series of thermoelectric intermediate members interconnecting a second plate with a first section of a first plate, and a second series of thermoelectric intermediate members interconnecting the second plate with a second section of the first plate. The first series may form a first temperature zone and the second series may form a second temperature zone. Each of the first and second series of thermoelectric intermediate members may be configured to electrically connect with a DC power supply to energize the first and second series and independently control temperatures of the first and second sections of the second plate.

20 Claims, 7 Drawing Sheets

OTHER PUBLICATIONS

"Thermoelectric Cooler CP0.8-31-06." Web publication, 3 pages. http://www.melcor.com/prodinfo.html. Melcor Corporation, a unit of Laird Technologies. Trenton, New Jersey.

"Thermoelectric Cooler PT4-12-30." Web publication, 3 pages. http://www.melcor.com/prodinfo.html. Melcor Corporation, a unit of Laird Technologies. Trenton, New Jersey.

"Thermoelectric Cooler RH1.4-14-10L." Web publication, 3 pages. http://www.melcor.com/prodinfo.html. Melcor Corporation, a unit of Laird Technologies. Trenton, New Jersey.

"Thermoelectric Cooler HOT1.2-18-F2A." Web publication, 3 pages. http://www.melcor.com/prodinfo.html. Melcor Corporation, a unit of Laird Technologies. Trenton, New Jersey.

"Thermoelectric Cooler ZT4,7,F1,2020." Web publication, 3 pages. http://www.lairdtech.com. Laird Technologies. St. Louis, Missouri.

"ML Series of Telecom TE Modules." Web publication, 3 pages. http://www.rmtltd.ru/te_mlseries.htm. RMT Ltd. Moscow, Russia.

"1MD04 specs." Web publication, 2 pages. http://www.rmtltd.ru/subpages/1md04_sub_sub.htm? RMT Ltd. Moscow, Russia.

"Frequently Asked Questions (FAQs) Thermoelectric Cooler." Web publication, 5 pages. http://www.marlow.com/technicalinfo/frequently_asked_questions_faqs.htm. Marlow Industries, a subsidiary of II-VI incorporated. Dallas, Texas.

\* cited by examiner

THERMOELECTRIC COOLER WITH MULTIPLE TEMPERATURE ZONES

BACKGROUND

The present application is directed to thermoelectric coolers and, more particularly, to thermoelectric coolers with at least two different temperature zones.

Thermoelectric coolers are solid state devices used to heat and cool items in a variety of industries, such as telecommunications and micro electronics. Thermoelectric coolers generally include first and second plates connected together by intermediate members. The thermoelectric coolers are configured to produce a temperature differential between the first and second plates with one of the plates being "hot" and the other plate being "cold". Current thermoelectric coolers are not configured for a single plate to provide multiple different temperature zones.

In some applications, it is desirable for a thermoelectric cooler to be able to produce multiple temperature zones. Multiple temperature zones may minimize power consumption because only limited sections of a plate are heated or cooled to specific temperatures and not the entire plate. Multiple temperature zones may also provide accurate temperature control to separate components that are served by a single plate.

Currently, multiple temperature zones require the use of multiple individual thermoelectric coolers. However, the use of multiple thermoelectric coolers may be difficult because of the lack of physical space available for positioning the additional thermoelectric coolers. Assembling multiple thermoelectric coolers may also be more expensive and time consuming. Also, it is difficult to maintain critical alignment across multiple thermoelectric coolers due to thermally induced expansions and distortions. Critical alignment is often a common requirement when using a thermoelectric cooler with optical components.

SUMMARY

The present application is directed to thermoelectric coolers that include multiple temperature zones. The thermoelectric cooler may include a first series of thermoelectric intermediate members interconnecting a second plate with a first section of a first plate. The first series forms a first temperature zone. The cooler may also include a second series of thermoelectric intermediate members interconnecting the second plate with a second section of the first plate. The second series forms a second temperature zone. Each of the first and second series of thermoelectric intermediate members may be configured to electrically connect with a DC power supply to energize the first and second series of intermediate members and independently control temperatures of the first and second sections of the second plate.

The various aspects of the various embodiments may be used alone or in any combination, as is desired.

DETAILED DESCRIPTION

Figure 1:
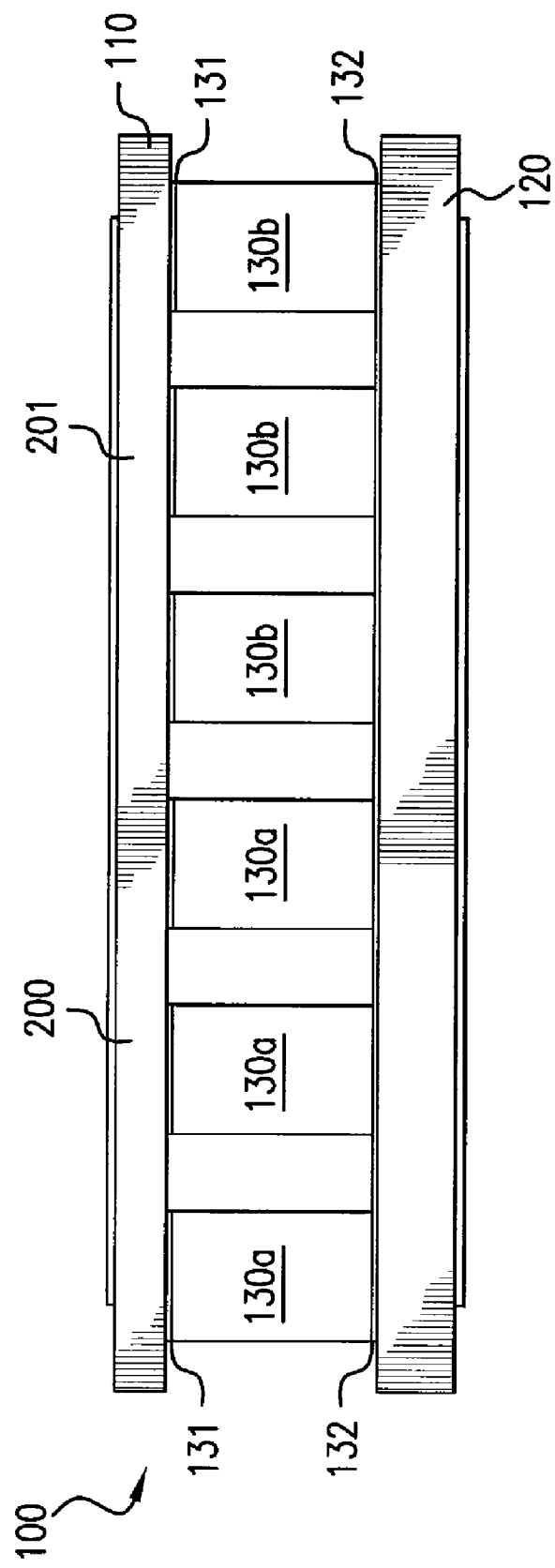
FIG. 1 is a schematic side view of a thermoelectric cooler according to one embodiment.

The present application is directed to a thermoelectric cooler with multiple different temperature zones. FIG. 1 illustrates one embodiment of a thermoelectric cooler 100 that includes a first plate 110 and a second plate 120. Intermediate members 130 are positioned between and connected to the plates 110, 120. The thermoelectric cooler 100 is configured for at least one of the plates 110, 120 to include different temperature zones. FIG. 1 includes the first plate 110 including a first temperature zone 200 that operates at a first temperature and a second temperature zone 201 that operates at a second temperature. The temperatures zones 200, 201 may operate at specific temperatures, or within specific temperature ranges. The temperature zones 200, 201 may include overlapping temperatures.

Figure 2:
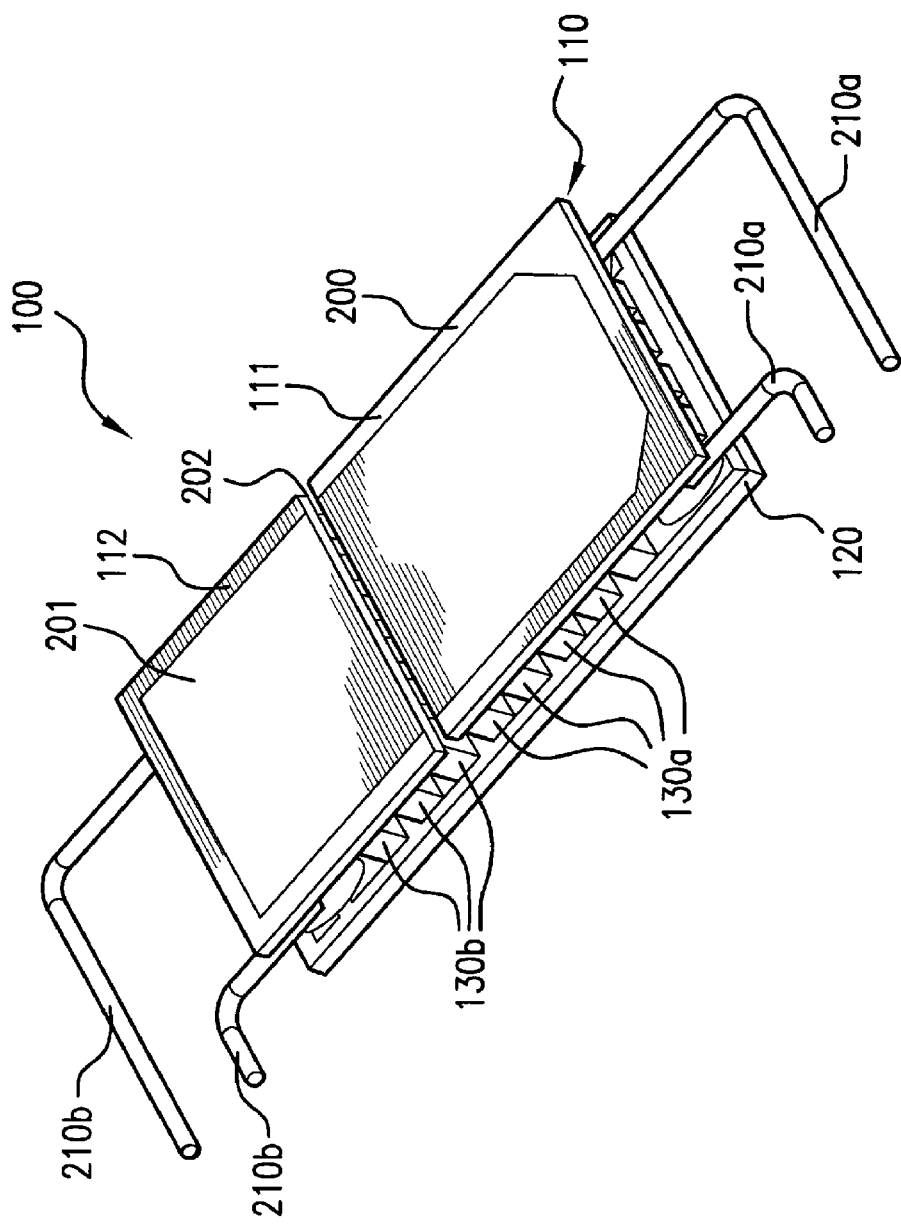
FIG. 2 is a perspective view of a thermoelectric cooler according to one embodiment.
Figure 3:
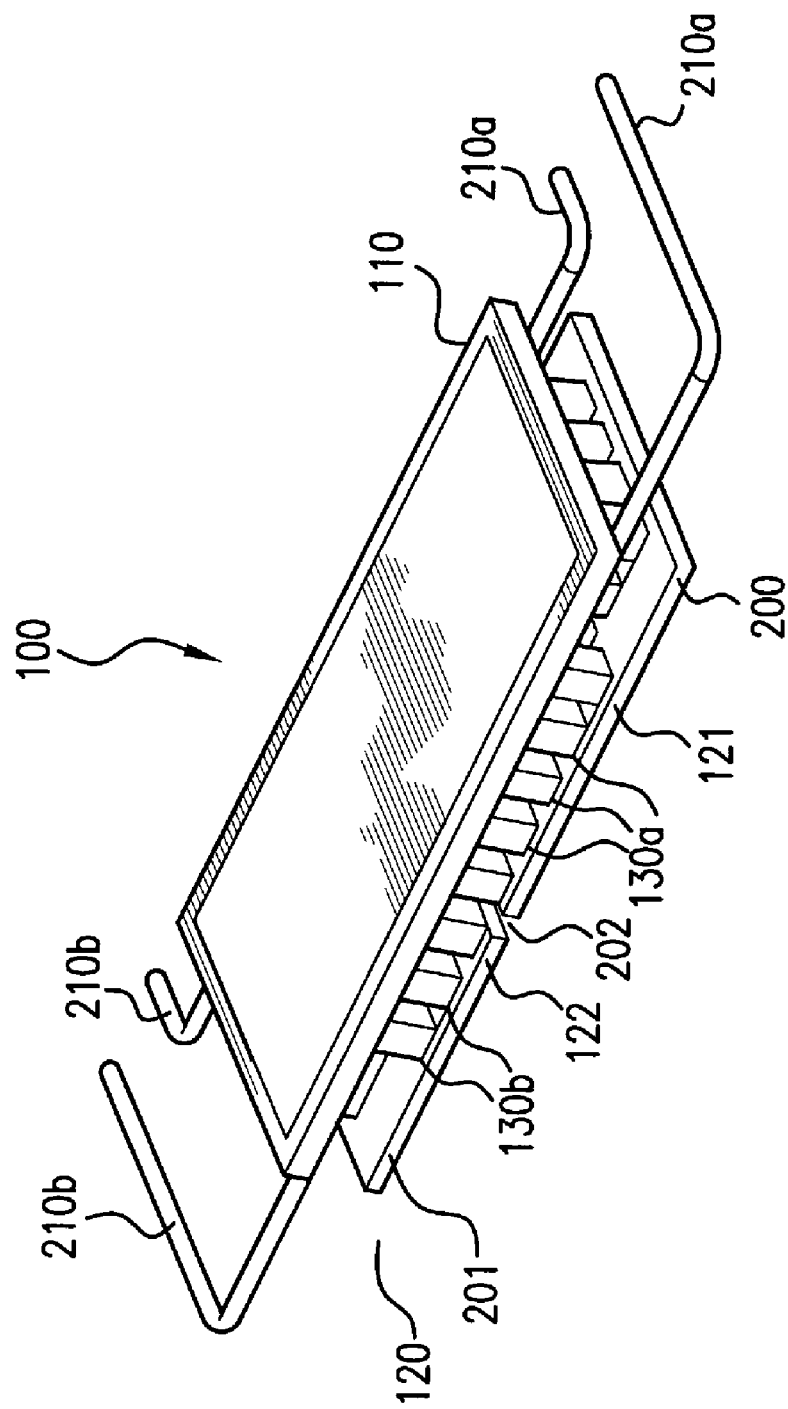
FIG. 3 is a perspective view of a thermoelectric cooler according to one embodiment.

The first and second plates 110, 120 serve as a housing and electrical insulation for the intermediate members 130. The size and shape of the plates 110, 120 may vary depending upon the context of use. The plates 110, 120 may include the same size and shape, or may include different sizes and/or shapes. One or both plates 110, 120 may be constructed from separate sections. FIG. 2 includes an embodiment with the first plate 110 including a first section 111 and a second section 112 and the second plate 120 including a single section. FIG. 3 includes an embodiment with the first plate 110 including a single piece, and the second plate 120 including a first piece 121 and a second piece 122. The multiple piece plates may be abutted together, or may be spaced apart with an intermediate gap 202. In one embodiment, a filler material may be placed within the intermediate gap.

Figure 4:
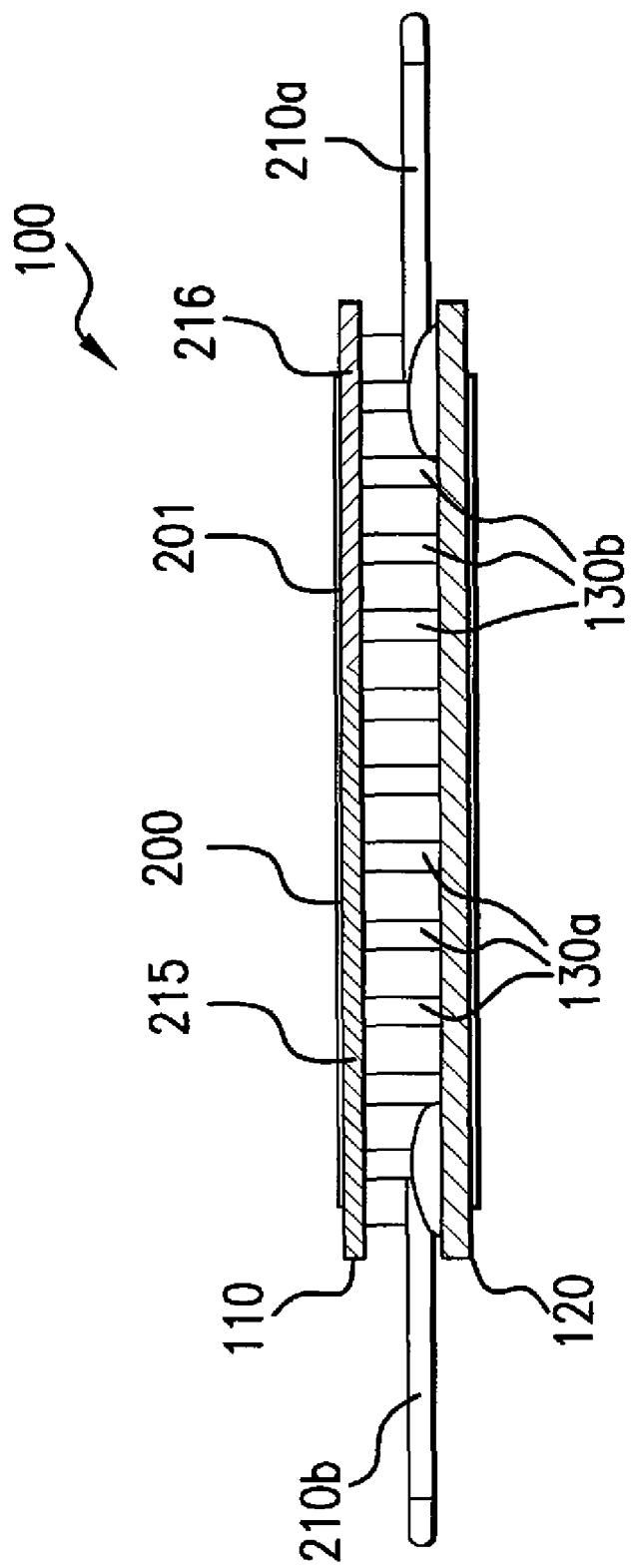
FIG. 4 is a cross sectional view of a thermoelectric cooler according to one embodiment.
Figure 5:
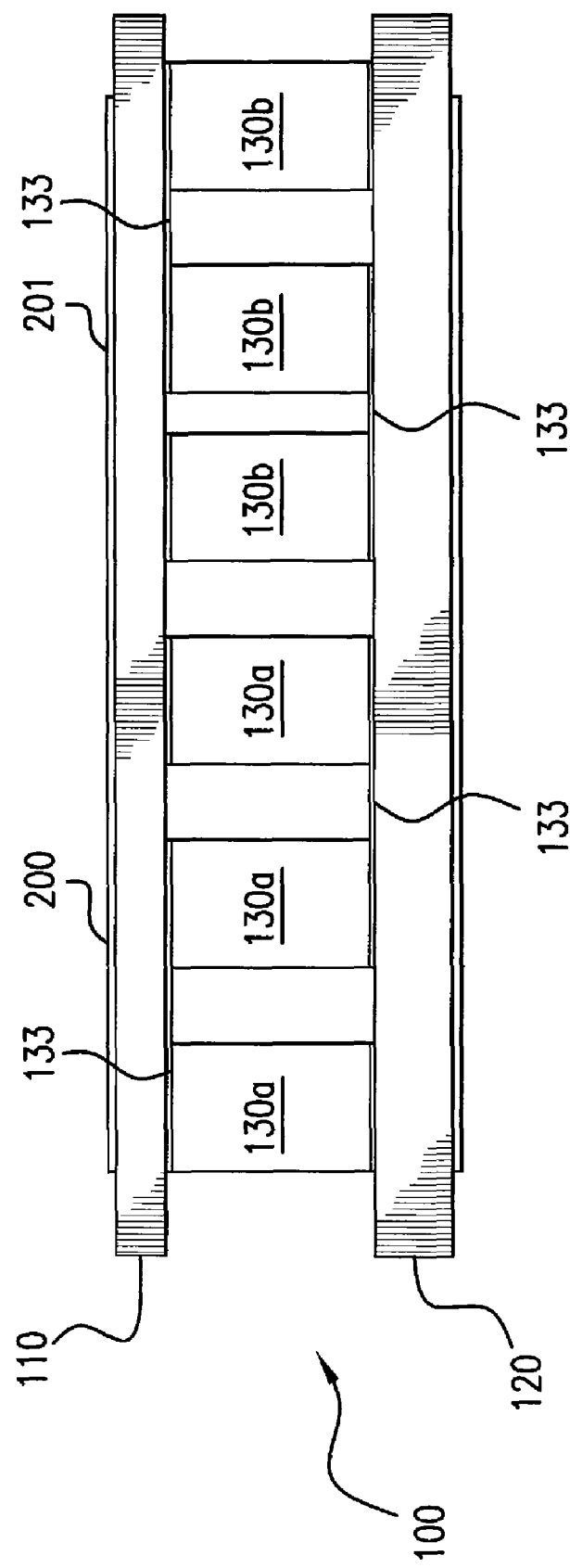
FIG. 5 is a schematic side view of a thermoelectric cooler according to one embodiment.

The plates 110, 120 may be constructed from a variety of materials, including ceramics. The plates 110, 120 may each be constructed from the same materials, or may be constructed from different materials. By way of example, the first plate 110 may be constructed from a first ceramic material, and the second plate 120 may be constructed from a different second ceramic material. One or both plates 110, 120 may be constructed from multiple different materials. FIG. 4 includes an embodiment with the first plate 110 constructed from a first material 215 and a second material 216. The intermediate members 130 may be soldered to each of the plates 110, 120. Connectors 133 as illustrated in FIG. 5 may be positioned between the intermediate members 130 and the plates 110, 120 to facilitate the connection. In one specific embodiment, the connectors 133 are constructed from copper. FIG. 5 also illustrates that each of the intermediate members 130 within a series are electrically in series and are thermally parallel.

The intermediate members 130 are positioned between the plates 110, 120. Each of the intermediate members 130 includes a first end 131 that is operatively connected to the first plate 110, and a second end 132 that is operatively connected to the second plate 120. The intermediate members 130 are constructed from semiconductor material that allows for electron flow through the member 130 when connected to a DC power source. The electron flow provides for heat to be transferred from one of the first and second ends 131, 132 to the opposing end. In one embodiment, the intermediate members 130 each include a pair of P and N type semiconductor elements. In one specific embodiment, the intermediate members 130 are constructed from Bismuth Telluride. The intermediate members may also include just N type semiconductor elements.

The intermediate members 130 are divided into two or more series 130a, 130b, etc. that each form one of the temperature zones. As illustrated in FIG. 1, the first series 130a forms the first temperature zone 200, and the second series 130b forms the second temperature zone 201. There may be any number of series of intermediate members 130 and temperature zones within the thermoelectric cooler 100. The temperature zones may include various sizes, shapes, and positions relative to the first and second plates 110, 120.

Each of the intermediate members 130 within a series is operatively connected to be electrically in series and thermally parallel. Leads 210 are connected at the end of each series to operatively connect the intermediate member series to a DC power source. As illustrated in FIGS. 2 and 3, a first pair of leads 210a is positioned at the ends of an intermediate member first series 130a, and a second pair of leads 210b at the ends of the intermediate member second series 130b. The leads 210 may be connected to the connectors 133 to facilitate the electrical connection. A DC power source is connected through the leads 210 to each of the intermediate member series. The various different leads 210 may be connected to a common DC power source, or different power sources.

Figure 6:
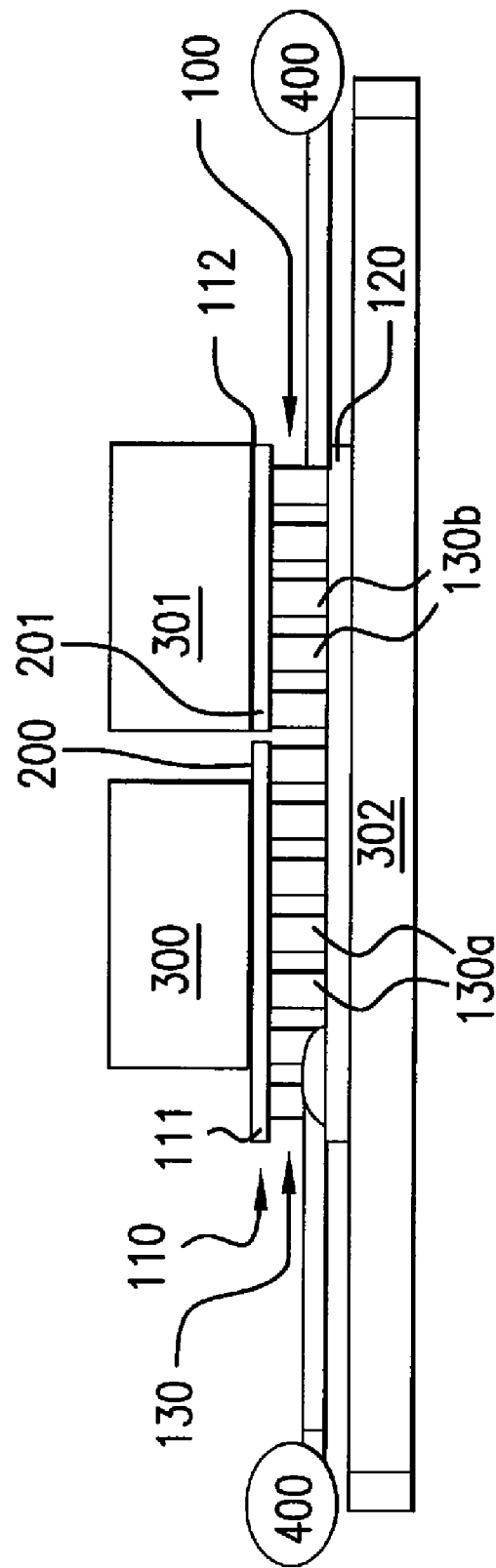
FIG. 6 is a side schematic view of a thermoelectric cooler positioned between components and a heat sink according to one embodiment.

FIG. 6 illustrates a schematic version of one embodiment of the thermoelectric cooler 100. This embodiment is constructed for removing heat from a first component 300 and a second component 301. The thermoelectric cooler includes the first plate 110 with first and second sections 111, 112, and the second plate 120. A first series of intermediate members 130a extends between the first section 111 and the second plate 120 to form a first temperature zone 200. A second series of intermediate members 130b extends between the second section 112 and the second plate 120 to form a second temperature zone 201. A first DC power supply 400 is connected to the first series of intermediate members 130a, and a second DC power supply 401 is connected to the second series of intermediate members 130b. The second plate 120 is thermally connected to a heat sink 302.

The thermoelectric cooler 100 is positioned with the first section 111 being thermally connected to the first component 300, and the second section 112 thermally connected to the second component 301. The thermoelectric cooler 100 may act as an insulator between the electrical components 300, 301 and the heat sink 302, and may also add rigidity to the electrical components 300, 301. In this embodiment, the intermediate members 130 and DC power supplies 400, 401 are configured such that the first plate 110 including sections 111, 112 is the cold side of the thermoelectric cooler 100, and the second plate 120 is the hot side.

In use, as the DC power supplies 400, 401 are activated, a current passes through each of the series of intermediate members 130. The current causes a decrease in temperature at the first plate 110 that absorbs heat from the components 300, 301. The heat is thermally transferred by electron transport through the plate 110 and intermediate members 130 and into the second plate 120. This heat is then transferred from the second plate 120 to the heat sink 302 as the electrons move towards a low energy state. The temperature in each zone 200, 201 is independently controlled based on the voltage supplied by the corresponding DC power supply 400, 401, and the construction of the intermediate members 130 and plates 110, 120.

In the embodiment of FIG. 6, the first temperature zone 200 operates at a first temperature that is different than the second temperature zone 201. The differences in the temperatures between the zones 200 may be caused by the number of intermediate members 130 within the zone, the type of material of the intermediate members 130, and the current provided by the power supply. Temperatures may also be affected by the type of material of the first and/or second plates 110, 120.

The plates 110, 120 may be changed to be either "hot" or "cold". By way of example, FIG. 6 includes the first plate 110 being cold and the second plate 120 being hot. Reversing the connection to the DC power supply causes heat transfer in the opposite direction such that the first plate 110 would be hot and the second plate 120 would be cold.

Figures 7A, 7B:
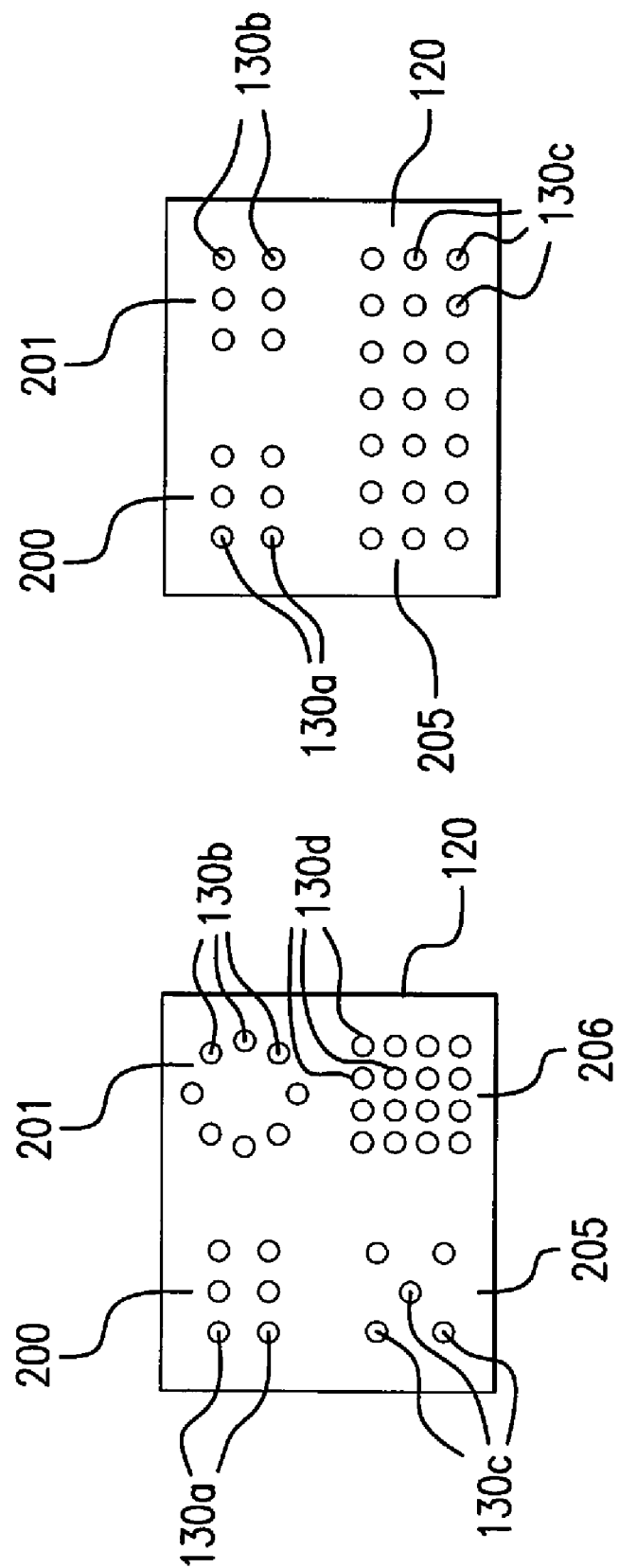
FIG. 7A is a top schematic view of temperature zones according to one embodiment.
FIG. 7B is a top schematic view of temperature zones according to one embodiment.

The sizing and spacing of the temperature zones may vary depending upon the desired context of use. FIGS. 7A and 7B include different embodiments with temperature zones of different sizes and configurations of intermediate members 130. For purposes of clarity, the first plate 110 has been removed from these figures. FIG. 7A includes an embodiment with four separate temperatures zones. Zone 200 is formed by a series of intermediate members 130a, zone 201 is formed by a series of intermediate members 130b, zone 205 is formed by a series of intermediate members 130c, and zone 206 is formed by a series of intermediate members 130d. The number and spacing of intermediate members 130 within each zone affects the temperature range of the particular zone. FIG. 7B includes an embodiment with three separate temperature zones. Zone 200 is formed by intermediate members 130, zone 201 by intermediate members 130b, and zone 205 is formed by intermediate members 130c.

In embodiments that share one or both plates 110, 120, the temperature differences at the edges may be different. By way of example in FIG. 7A, the temperature of the inner edge of zone 200 may be different than the temperature at the middle of the zone. This is caused because of the heat transfer that occurs in the plate 120 between adjacent zones. Embodiments that separate the plates with different sections (e.g., plate 110 of FIG. 2) may include the entire zone operating at the same temperature.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The present invention may be carried out in other specific ways than those herein set forth without departing from the scope and essential characteristics of the invention. In one embodiment, one of the temperature zones includes a greater area than another temperature zone. The present embodiments are, therefore, to be considered in all respects as illustrative and not restrictive, and all changes coming within the meaning and equivalency range of the appended claims are intended to be embraced therein.

What is claimed is:

1. A thermoelectric cooler having independently controlled first and second temperature zones, the thermoelectric cooler comprising:
   a first series of thermoelectric intermediate members interconnecting a second plate with a first section of a first plate defining a first temperature zone;
   a second series of thermoelectric intermediate members interconnecting the second plate with a second section of the first plate defining a second temperature zone; and
   each of the first and second series of thermoelectric intermediate members configured to electrically connect with a DC power supply to energize the first and second series of intermediate members and independently control temperatures of the first and second sections of the first plate.

2. The thermoelectric cooler of claim 1, wherein the first and second sections are formed by separate pieces of the first plate with a first piece forming the first section and a second piece forming the second section.

3. The thermoelectric cooler of claim 1, wherein the first plate is a single piece.

4. The thermoelectric cooler of claim 1, wherein the first temperature zone includes a greater number of the thermoelectric intermediate members than the second temperature zone.

5. The thermoelectric cooler of claim 1, wherein the first section of the first plate includes a greater area than the second section of the first plate.

6. The thermoelectric cooler of claim 1, further comprising connectors positioned between first ends of each of the thermoelectric intermediate members and the first plate, the connectors constructed from an electrically conductive material.

7. The thermoelectric cooler of claim 1, wherein the first series of thermoelectric intermediate members are electrically in series and are thermally parallel and the second series of thermoelectric intermediate members are electrically in series and are thermally parallel.

8. A thermoelectric cooler comprising:
   a first plate;
   a second plate spaced away from the first plate;
   a plurality of elements positioned between the first and second plates each including a first end operatively connected to the first plate and a second end operatively connected to the second plate and each including coupled P-type and N-type semiconductor elements, the plurality of elements divided into a first group that is electrically in series and a separate second group that is electrically in series;
   the first series forming a first temperature zone in a first section of the first plate that causes a first temperature differential between the first section of the first plate and the second plate when connected to a first DC power supply;
   the second series forming a second temperature zone in a second section of the first plate that causes a second temperature differential between the second section of the first plate and the second plate when connected to a second DC power supply.

9. The thermoelectric cooler of claim 8, wherein the first plate includes first and second separate pieces with the first piece forming the first section and the second piece forming the second section.

10. The thermoelectric cooler of claim 9, further comprising a gap positioned between the first and second pieces.

11. The thermoelectric cooler of claim 8, wherein the first temperature zone includes a greater area of the first plate than the second temperature zone.

12. The thermoelectric cooler of claim 8, wherein the first series includes a greater number of the plurality of elements than the second series.

13. The thermoelectric cooler of claim 8, wherein the plurality of elements is divided into a third group that is electrically in series and separate from the first and second groups, the third group forming a third temperature zone in a third section of the first plate that causes a third temperature differential between the third section of the first plate and the second plate when connected to a third DC power supply.

14. A thermoelectric cooler comprising:
   a first series of semiconductor elements electrically connected together in series;
   a second series of semiconductor elements electrically connected together in series;
   a first plate connected to first ends of the first and second series of semiconductor elements;
   a second plate connected to second ends of the first and second series of semiconductor elements;
   the first series of semiconductor elements being connected to a first section of the first plate;
   the second series of semiconductor elements being connected to a second section of the first plate;
   the first series of semiconductor elements configured to cool the first section of the first plate to a first temperature when connected to a first DC power supply;
   the second series of semiconductor elements configured to cool the second section of the first plate to a second temperature different than the first temperature when connected to a second DC power supply.

15. The thermoelectric cooler of claim 14, wherein each of the first and second series of semiconductor elements comprises pluralities of paired P-type and N-type semiconductor members.

16. The thermoelectric cooler of claim 14, further comprising a third series of semiconductor elements electrically connected together in series, the third series configured to cool a third section of the first plate to a third temperature different than the first and second temperatures when connected to a second DC power supply.

17. The thermoelectric cooler of claim 14, wherein the first plate comprises first and second independent pieces with the first piece forming the first section and the second piece forming the second section.

18. The thermoelectric cooler of claim 14, wherein each of the first and second plates are single pieces.

19. The thermoelectric cooler of claim 14, wherein the first section of the first plate is constructed from different materials than the second section of the first plate.

20. The thermoelectric cooler of claim 14, wherein there are a greater number of the semiconductor elements in the first temperature zone than in the second temperature zone.

* * * * *